United States Patent
Fujii (12)

(10) Patent No.: US 6,291,804 B1
(45) Date of Patent: Sep. 18, 2001

(54) JOINED STRUCTURE OF CERAMIC HEATER AND ELECTRODE TERMINAL, AND JOINING METHOD THEREFOR

(75) Inventor: Tomoyuki Fujii, Nagoya (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/537,052

(22) Filed: Mar. 28, 2000

(30) Foreign Application Priority Data

Mar. 31, 1999 (JP) .................................................. 11-092889

(51) Int. Cl.[7] .............................. H05B 3/08; H05B 3/10; B23K 20/10
(52) U.S. Cl. ..................... 219/541; 219/553; 228/110.1
(58) Field of Search ....................................... 219/270, 537, 219/538, 541, 542, 543, 544, 548, 552, 553; 338/322, 326–328, 332, 22 R; 228/110.1, 112.1, 180.1

(56) References Cited

U.S. PATENT DOCUMENTS

| | | | |
|---|---|---|---|
| 4,803,345 | * | 2/1989 | Hoshizaki et al. .................. 219/553 |
| 4,804,823 | * | 2/1989 | Okuda et al. ........................ 219/553 |
| 4,883,947 | * | 11/1989 | Murase et al. ...................... 219/553 |
| 5,756,971 | * | 5/1998 | Hipp .................................... 219/537 |
| 6,039,238 | * | 3/2000 | Panaghe ........................... 228/110.1 |

* cited by examiner

*Primary Examiner*—Tu Ba Hoang
(74) *Attorney, Agent, or Firm*—Burr & Brown

(57) ABSTRACT

A metallized layer is formed by active metal solder on the surface of a ceramic base material to be joined to a terminal electrode, and metal solder is interposed between the metallized layer and the electrode terminal to join the ceramic heater and the electrode terminal. The joined structure obtained provides for a higher reliability of the joining strength between the terminal joining portion of the heater and the electrode terminal, which prolongs the life of the heater.

12 Claims, 6 Drawing Sheets

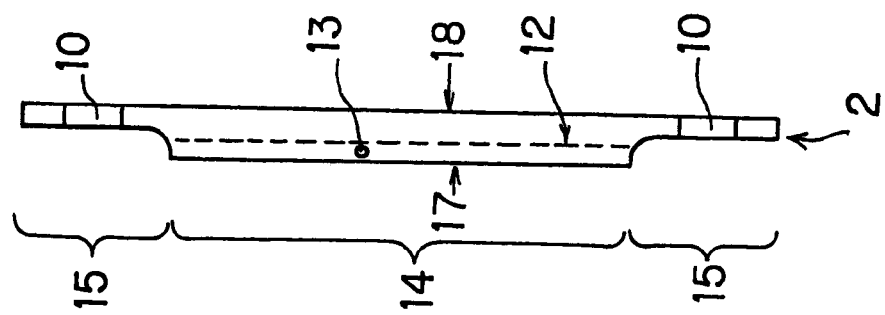
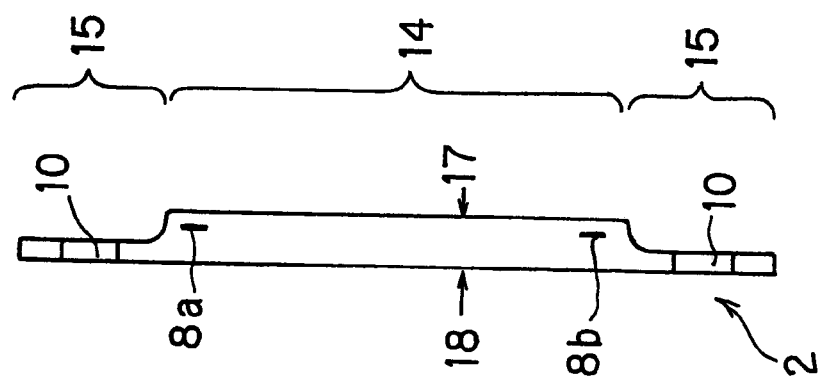
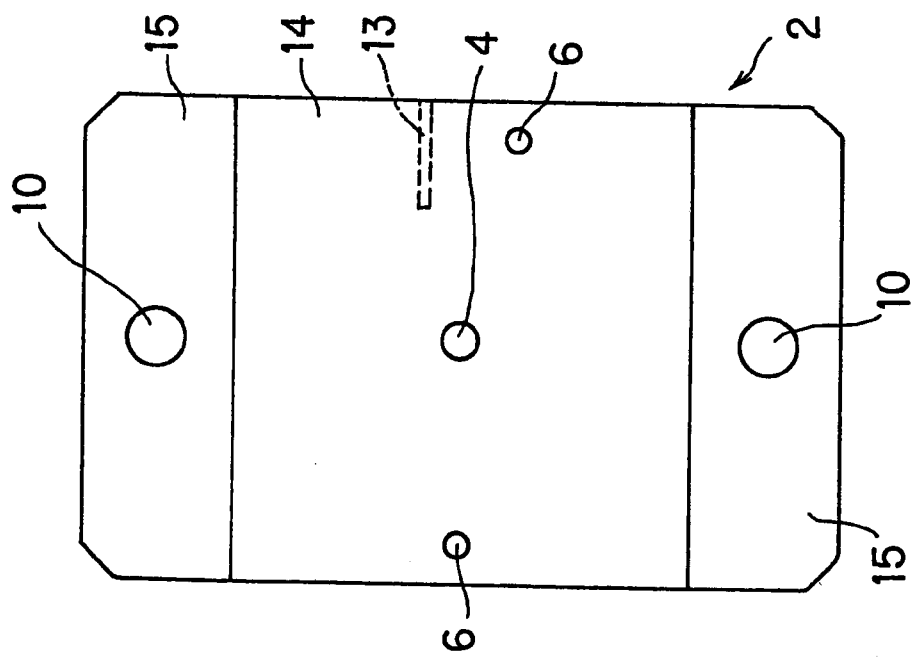

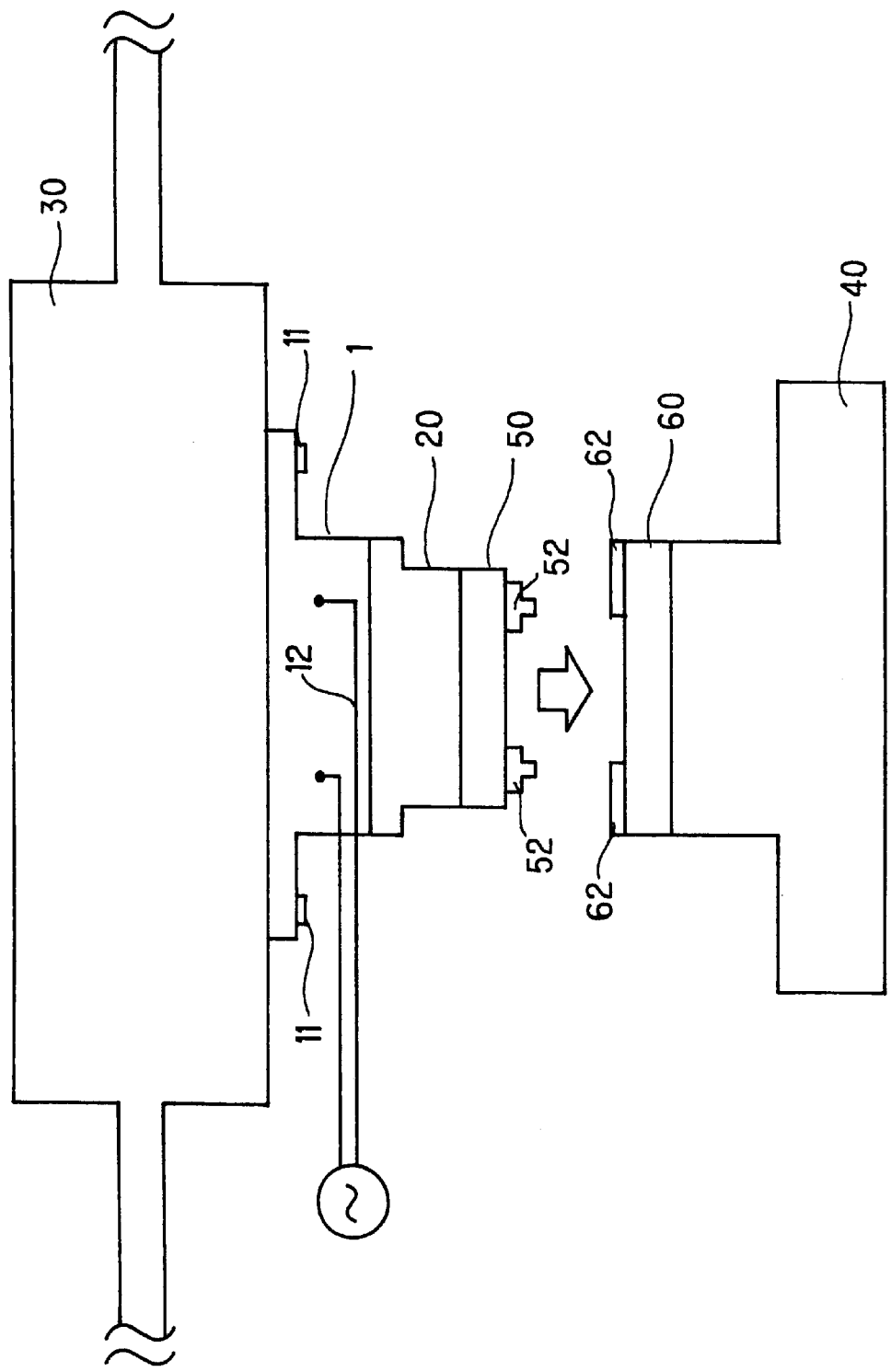
Fig. 6 - Prior Art

JOINED STRUCTURE OF CERAMIC HEATER AND ELECTRODE TERMINAL, AND JOINING METHOD THEREFOR

BACKGROUND OF THE INVENTION AND RELATED ART STATEMENT

The invention relates to a joined structure of a ceramic heater and an electrode terminal, and a joining method therefor.

With higher speed and higher pin counts of semiconductor devices, semiconductor implementation technology providing narrower pitch and higher accuracy has been becoming more and more important.

In particular, the flip chip bonding (FCB) technique shown in FIG. 7 (a) has been used for the COG in liquid crystal panel package and MCM implementation in computers and portable telephones. In this technique, a Si chip 50 of a semiconductor device and an electrode 62 on a board 60 are directly bonded at a bonding terminal (bump) 52 of solder and Au solder by means of a thermocompression technique.

This flip chip bonding (FCB) technique provides more compact, smaller and faster devices than the wire bonding (WC) and tape carrier (TC) techniques in which conventional lead wires 54 (FIG. 7b), 56 (FIG. 7c) are used for bonding. Therefore, it is expected that the flip chip bonding technique will be mainstream instead of the wire bonding technique (WC) in the future.

FIG. 6 illustrates an example of apparatuses used for flip chip bonding.

When flip chip bonding is performed, a tool head 20 of the size corresponding to the Si chip 50 is selected and fixed to a heater 1 by vacuum absorption. Next, the Si chip 50 is attached to the tool head 20, also by vacuum absorption.

Therein, the heater 1 is secured to a jacket 30 for forced-cooling of the Si chip 50 by screws 11.

Then, a board 60, on which an electrode 62 to be bonded to the Si chip 50 is disposed, is secured to a board stage 40 by vacuum absorption.

Then, the tool head 20 is lowered in the direction perpendicular to the board stage 40, and positioned until the bonding terminal 52 on the Si chip 50 is brought into contact with the electrode 62 on the board 60. Thereafter, the predetermined load (about maximum 50 kgf) is applied to the tool head 20 and at the same time the Si chip 50 is rapidly heated to a predetermined temperature (from 50° C. to approximately 450–500° C. about 5 seconds) which is then kept for a given time (about 3 to 5 sec) . Thus, the bonding terminal (bump) 52 on the Si chip 50 and the electrode 62 on the board 60 are thermo-compressed to each other.

And then, the power of the heater 1 is switched off without delay, and forced cooling (water-cooled or air-cooled) of the jacket 30 rapidly lowers the temperature of the Si chip 50 placed on the tool head 20 (from 450–500° C. to100° C. about 20 sec). Thereby, the bonding terminal (bump) 52 on the Si chip 50 and the electrode 62 on the board 60 are bonded together. Thus, the flip chip bonding (FCB) is completed.

In this case, in order to prevent the bonding terminal (bump) 52 on the Si chip 50 from being spread and at the same time to reduce thermal damage to the Si chip 50, rapid temperature rise and drop (temperature rise: less than or equal to 5 sec., temperature drop: less than or equal to 20 sec.) are essential for ensuring flip chip bonding (FCB).

For meeting the conditions described above, recent bonding heaters 1 mainly used are made of ceramics such as aluminum nitride, silicon carbide, and silicon nitride which are excellent in the characteristics of thermal conductivity, heating uniformity, heat dissipation ability, and thermal shock resistance.

So, it is required in the method for joining an electrode terminal to the heater 1 described above that the joint portion is vacuum-tight such that a heating element embedded in the heater may be protected from high temperature air, in addition to high electric conductivity and having enough joining strength.

To this end, when a joining metal of the electrode terminal is joined to the heater, it is necessary to join the heating element and the ceramic base material surrounding it at the same time. Therefore, conventionally, active metal solder has been used for joining them.

However, as shown in FIG. 3, if the joining metal of a ceramic base material 2 and an electrode terminal 80 are joined directly to each other by a metal solder 90, active metals in the metal solder 90 react with the joining metal of the electrode terminal 80. So, this reaction causes a deficiency of active metals which can react with ceramic base material 2, and so results in poor wettability between the ceramic base materia 12 and the metal solder 90. Consequently, there have been problems of a remarkable reduction in the joining strength between them and the short life of the heater.

In particular, these problems are outstanding in electrode terminals made of metals such as kovar and SUS, which include as main ingredients one or more kinds of the groups consisting of Fe, Ni, Co.

The present invention has been performed, considering such problems of the conventional joining technology. An object of the invention is to provide a joined structure and a joining method therefor which allow high reliability of the joining strength between a heater and an electrode terminal and also the longer life of the heater.

SUMMARY OF THE INVENTION

More specifically, the invention provides a joined structure comprising a ceramic heater and an electrode terminal, the ceramic heater comprising a heating element and a ceramic base material in which the heating element is embedded; wherein a metallized layer is made of an active metal solder on the surface of the ceramic base material to which the electrode terminal is joined; and a metal solder is interposed between said metallized layer and said electrode terminal to join the metallized layer and the electrode terminal.

Further, the invention provides a method for joining a ceramic heater comprising a ceramic base material in which a heating element is embedded and an electrode terminal, the method comprising; forming a metallized layer made of an active metal solder on the surface of the ceramic base material to which the electrode terminal is joined, placing a metal solder between said metallized layer and said electrode terminal, and then heat-treating them to join the ceramic heater and the electrode terminal.

According to the invention, the active metal solder is preferably Ag—Cu—Ti alloy, Cu—Ti alloy, or Au—Ti alloy, and also the metal solder is preferably Ag solder, Cu solder, Ni solder, or Au solder, which is used to join active metal solders and metals to each other.

Further, the electrode terminal is preferably a metal including as main ingredients one or more kinds of the groups consisting of Fe, Ni, and Co, and more preferably kovar having a low thermal expansion coefficient and good oxidation resistance.

Further, according to the invention, the ceramic heater is a bonding heater comprising a heater portion in which a heating element is embedded and a holder portion integrally combined to the heater portion for securing the heater portion.

Yet further, according to the invention, the ceramic base material is a single material, and preferably formed of silicon nitride, aluminum nitride, or silicon carbide, which may be either closely packed or porous.

BRIEF DESCRIPTION OF THE DRAWINGS

FIG. 2(b) is the left side view, and FIG. 2(c) is the section view.

FIGS. 4(a)–(c) show examples of the bonding heaters fabricated in Embodiment 2 and the Comparative Example 2, in which FIG. 4(a) is the front view, FIG. 4(b) is the left side view, and FIG. 4(c) is the right side view.

FIG. 6 shows a diagrammatic illustration of an example of apparatuses used for flip chip bonding (FCB).

FIGS. 7(a)–(c) show the main methods of semiconductor mounting technologies, in which FIG. 7(a) is flip chip bonding (FCB) technique, FIG. 7(b) is wire bonding (WB) technique, and FIG. 7(c) is tape carrier (TC) technique.

DETAILED DESCRIPTION OF PREFERRED EMBODIMENTS

In the method for joining a ceramic heater and an electrode terminal and the joined structure therebetween according to the invention, after a metallized layer of an active metal solder is formed on the surface of a ceramic base material to which an electrode terminal is joined, a metal solder is placed between the above described metallized layer and the above described electrode terminal, and then they are joined by heat treatment.

Thereby, the invention allows a higher reliability of the joining strength between the heater and the electrode terminal, and the longer life of the heater. Hereafter, the invention will be described with reference to the accompanying drawings.

Figure 1:
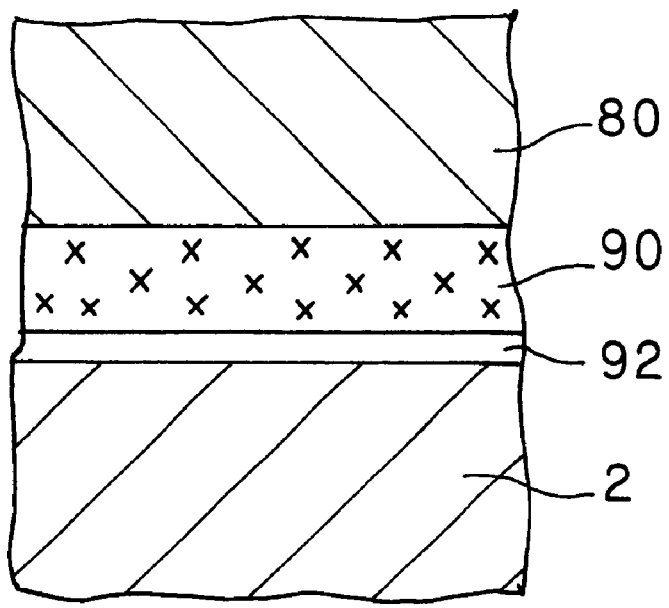
FIG. 1 illustrates the joined structure between a ceramic base material and an electrode terminal according to the invention.
Figure 2A:
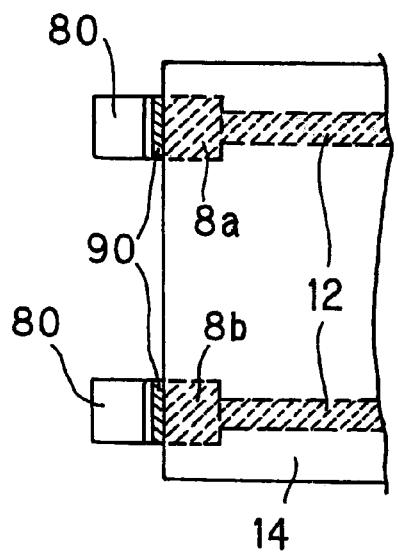
FIGS. 2(a)–(c) show one embodiment of the joined structure between the ceramic heater and the electrode terminal of the invention, in which FIG. 2 (a) is the front perspective view.
Figure 2B:
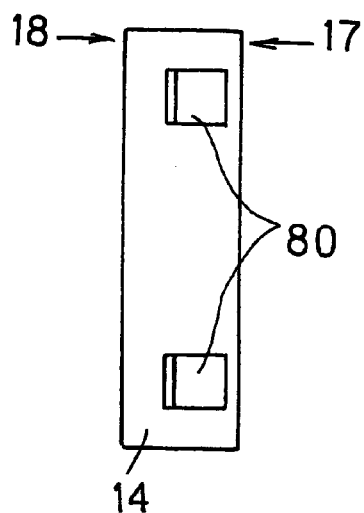
Figure 2C:
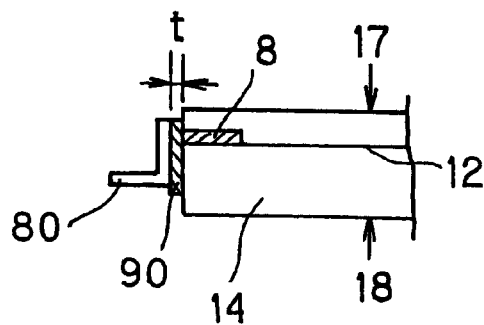

FIG. 1 illustrates the joined structure of a ceramic base material and an electrode terminal according to the invention. FIGS. 2 (a)–(c) show representative portions of one embodiment according to the joined structure of an electrode terminal of the invention, in which FIG. 2(a) is a perspective front view, FIG. 2(b) is a left side view, and FIG. 2(c) is a section view.

Here, a main feature of the method for joining a ceramic heater and an electrode terminal and the joined structure therebetween according to the invention is in that, before joining the electrode terminal 80 and the ceramic base material 2 by the metal solder 90 for example, as shown in FIG. 1, a metallized layer 92 (where metal particles are embedded in the surface of ceramics) is formed of an active metal solder on the surface of the ceramic base material 2 to which the electrode terminal 80 is joined.

Thereby, it is possible to prevent active metals in the metal solder 90 from being deficient to react with the ceramic base material 2, so that wettability between the ceramic base metal 2 and the metal solder 90 can be improved.

Then, a metal solder layer 90 is placed between the metallized layer 92 formed on the ceramic base material 2 and the electrode terminal 80, and then they are joined by heat treatment.

Figure 3:
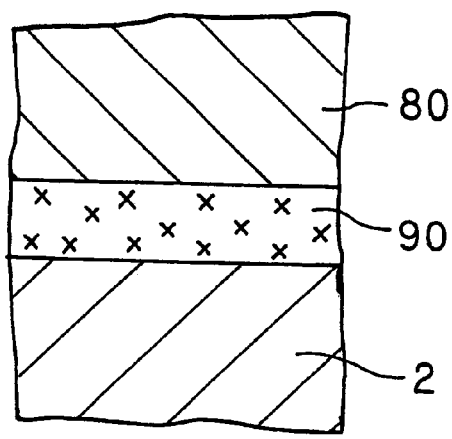
FIG. 3 illustrates a conventional joined structure between a ceramic base material and an electrode terminal.

Thereby, the joining strength between the ceramic base material 2 and the electrode terminal 80 can be improved, when compared with the conventional joining method (see FIG. 3).

By the way, the metal solder 90 may be Ag solder, Cu solder, Ni solder, or Au solder, which is used to join active metal solders or usual metals to each other.

Although the active metal solders used in the invention is not particularly limited, considering the temperature of the heater in use and workability in manufacturing the heater, they are preferably Ag—Cu—Ti alloy, Cy—ti alloy, or Au—Ti alloy.

By the way, the active metal solder described above may be a sheet-type solder or a paste-type solder.

It is required that the electrode terminals 80 used in the invention have a small difference in thermal expansion from the ceramic base material 2, because undue stress against the ceramic base material 2 which forms the heater 1 body is undesirable, and further have good oxidation resistance, because they are exposed to high temperatures in air.

From the above, the electrode terminal 80 is preferably made of a metal including as main ingredients one or more kinds of the groups consisting of Fe, Ni, and Co, for example kovar.

Here, although the ceramic heater of the invention is not particularly limited, it is preferably a bonding heater, and more preferably comprises a ceramic base material having a heater portion in which a heating element is embedded, and a holder portion integrally combined to the heater portion for securing the heater portion.

From this, when compared with conventional heaters in which the heater portion and the holder portion are separated from each other, it is possible in the heater of the invention that a reduction in thermal contact resistance allows faster decreasing of temperature. No occurrence of stress concentration due to localized temperature variation provides higher reliability of the joining strength. Further stiffness of the heater makes its thermal deformation difficult to occur and so provides good flatness of the heater surface.

Figure 5A:
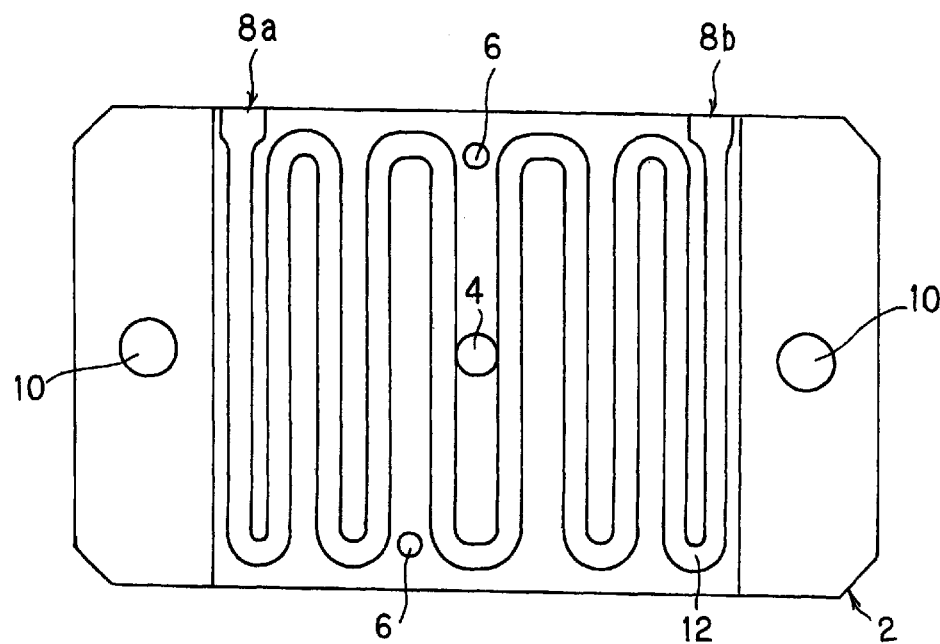
FIGS. 5(a),(b) show an example of the placement of an heating element in the bonding heater fabricated in the Embodiment 2 and the Comparative Example 2, in which FIG. 5 (a) is the front perspective view
Figure 5B:
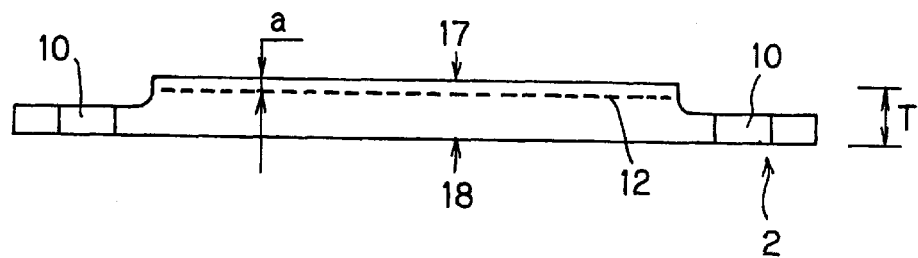
FIG. 5(b) is the side perspective view.
Figure 7A:
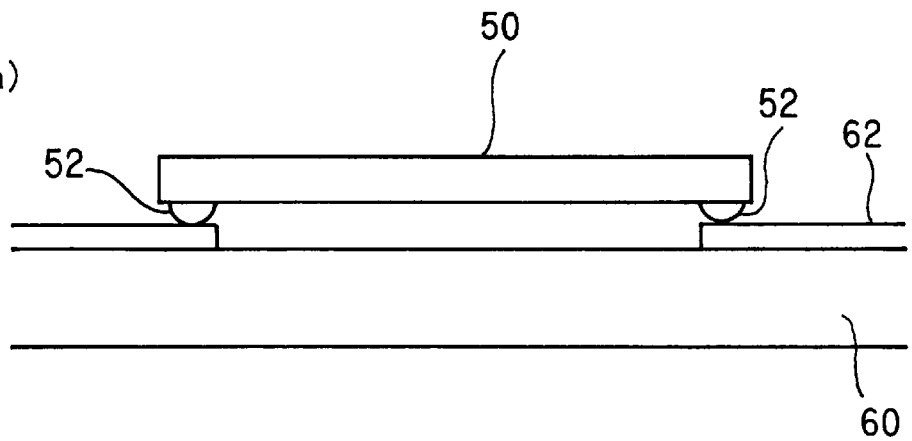
Figure 7B:
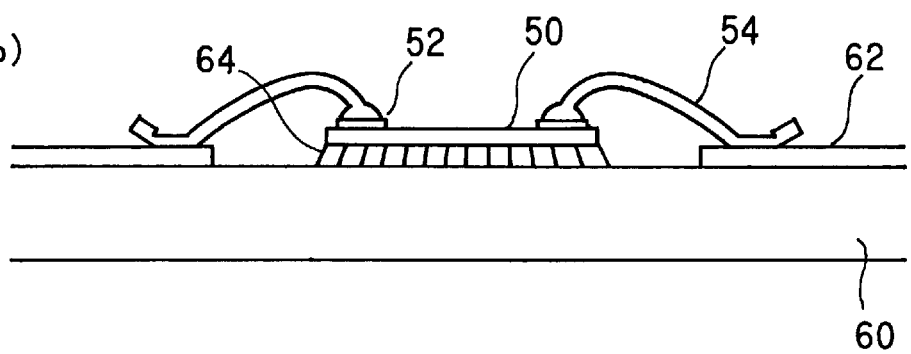
Figure 7C:
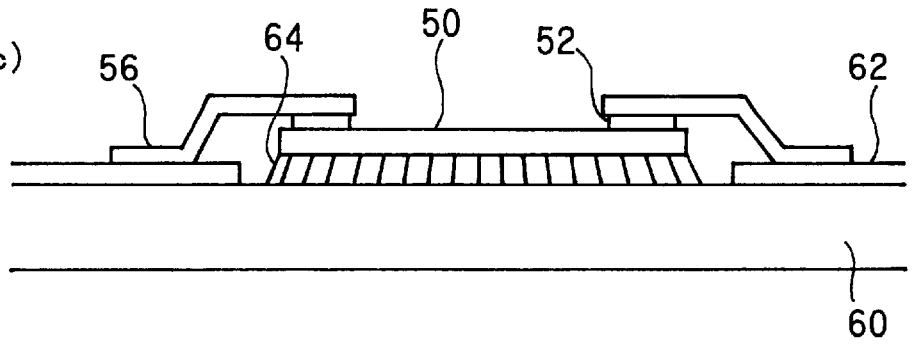

The bonding heater described above, for example as shown in FIGS. 4 (a)–(c) and FIG. 5 (a), (b), comprises the ceramic base material 2 having the heater portion 14 (in which the heating element 12 is embedded), and the holder portion 15 integrally combined for securing the heater portion 14. The bonding heater further comprises a Si chip vacuum absorption hole 4 for fixing the Si chip 50 (see FIG. 6) through the tool head 20 (see FIG. 6) by vacuum absorption, a terminal joining portion 8 for powering the heating element 12, a temperature measurement thermocouple hole 13 used for measuring the temperature of the bonding heater 1, a tool head vacuum absorption hole 6 for fixing the tool head 20 (see FIG. 6) by vacuum absorption, and a securing screw hole 10 for securing the bonding heater 1 to the jacket 30 (see FIG. 6).

Here, a distance from the heating surface 17 of the ceramic base material 2 to the heating element 12 is preferably 1–3 mm (see FIG. 5(*b*) ).

Further, the thickness T of the ceramic base material is preferably greater than or equal to 10 mm in order to make its stiffness greater than that of the heating element 12 (see FIG. 5(*b*)).

By the way, the heating element 12 used in the invention is preferably made of powder paste comprising a heavy metal or a heavy metal carbide.

In particular, the use of a heavy metal carbide can avoid carbonization of heavy metals while ceramic base materials and heating elements of a heavy metal carbide are sintered into a one-piece construction, so that it is possible to prevent the occurrence of peeling around the heating element in the ceramic base material.

In this case, the heavy metals used in the invention are not particularly limited as long as they are conventional refractory metals, but they are preferably molybdenum or tungsten.

By the way, the ceramic base materials 2 used in the invention preferably have a deflection strength greater than 300 MPa , fracture toughness greater than or equal to 2 MPa·m$^{1/2}$, thermal shock resistance greater than or equal to ΔT 500° C., as well as thermal conductivity greater than or equal to at least 30 W/m·K.

To this end, the ceramic base material 2 is made of a single material, and preferably made of silicon nitride, aluminum nitride, or silicon carbide. In particular, when the jacket 30 (see FIG. 6) performs forced cooling, the ceramic base material 2 is preferably made of silicon nitride which is excellent in deflection strength, fracture toughness, and thermal shock resistance.

EXAMPLE

The invention will be described more in detail based on examples, but the invention is not limited to these examples.

Example 1, Comparative Example 1

Two pairs of samples (4 pieces in total) made of silicon nitride which has the same material properties as the ceramic base material for the ceramic heater, were made available.

For one pair of the samples, a metallized layer was formed of an active metal solder consisting of Ag—Cu—Ti alloy on the surface of the sample to be joined (Embodiment 1).

Then, for each of the two pairs, after a sheet of active metal solder consisting of Ag—Cu—Ti alloy was stacked on the surfaces of the samples to be joined, the respective two samples sandwiched a kovar plate (0.1 mm in thickness) of the same material properties as electrode terminals therebetween and were compressed at 850° C. in a vacuum furnace to be joined to each other.

Example 1, Comparative Example 1

In order to test the joining strength of each joint (Example 1, Comparative Example 1) joined by the method described above, a 4 point bending strength test pursuant to JIS R-1601(fine ceramics bending strength test method) was performed on them. The test results are shown in table 1.

TABLE 1

| | Bending strength (MPa) |
|---|---|
| Example 1 | 479 |
| Comparative Example 1 | 64 |

Example 2, Comparative Example 2

By die pressing (compacting pressure: 200 kg/cm$^2$), silicon nitride granules was formed into a pressed compact (A).

A powder paste was prepared by adding polyvinyl butyral as a binder to 99 wt % tungsten powder (average particle diameter: 1.1 μm) and adjusting viscosity thereof by means of butyl carbitol.

This powder paste was screen-printed on the upper surface of the pressed compact A in the shape as shown in FIG. 5 (*a*).

After silicon nitride granules were deposited on the pressed compact A screen-printed with the powder-paste in a metal die, die pressing (compacting pressure: 200 kg/cm$^2$) was applied to it for fabricating a pressed compact B.

The pressed compact B described above was compacted by means of cold isostatic press (CIP) with a pressure of 7 t and then subjected to white processing for fabricating a pressed compact C.

The pressed compact C was temporally baked in an atmosphere of nitrogen at 500° C. for 2 hr for removing resins such as binder therefrom, and thereafter burned in an atmosphere of nitrogen at 1870° C. for 3 hr. Thus, a ceramic base material, in which the heating element was embedded, and in which the heater portion and the holder portion was combined in one piece, was fabricated.

The ceramic base material obtained was ground and then polished by a surface sander in a machining center, by which a one-piece bonding heater shown in FIG. 4 was fabricated cl Example 2, Comparative Example 2

Then, as shown in FIGS. 2(*a*)–(*c*), the terminal joining portion 8 of the heater 1 described above was joined to the electrode terminal 80.

At that time, in the Example 2, as shown in FIG. 1, an active metal solder of Ag—Cu—Ti based alloy was used to form the metallized layer 92 on the surface (periphery of the terminal joining portion 8) of the ceramic base material 2 to be joined to the electrode terminal 80. Thereafter, an active metal solder 90 of Ag—Cu—Ti based alloy (melting point: 850° C.) was placed between the metallized layer 92 and the electrode terminal 80. Then, they were joined by press-joining at 850° C. in a vacuum furnace.

On the other hand, in the Comparative Example 2, as shown in FIG. 3, a metal solder layer 90 of Ag—Cu—Ti based alloy was placed between the surface (periphery of the terminal joining portion 8) of the ceramic base material 2 and the electrode terminal 80, and then they were joined to each other by press-joining at 850° C. in vacuum furnace.

Each bonding heater obtained (Example 2, Comparative Example 2) was mounted to the apparatus for use in flip chip bonding (FCB), shown in FIG. 6. Then, a heat cycle endurance test was performed by repeating a heat cycle up to reach the life of the heater mounted. Here, one heat cycle is a process in which the Si chip was rapidly heated to 500° C. (from 500° C. to 500° C. for 5 sec), and then kept at 500° C. for a given time (3–5 sec), and thereafter rapidly cooled (from 500° C. to 100° C. for 20 sec) . The test results and the joining state of the electrode terminals of the heaters after the heat cycle endurance test are shown in table 2.

TABLE 2

|  | Heat cycle endurance (cycle) | Jointing state of electrode terminal |
|---|---|---|
| Example 2 | Above 50 thousands | Good |
| Comparative Example 2 | 2000 | Bad |

Consideration: Example 1 and 2, Comparative Example 1 and 2

From table 1, in the Example 1, after a metallized layer of active metal solder is formed on the surface of a ceramic base material, the metal and the ceramic base are joined by an active metal solder. Thus, the wettability of the ceramics and the active metal solder can be improved, and so, the joining strength of the ceramics and the metal is increased, when compared with the Comparative Example 1.

Further, in the Example 2, because the joining strength of the terminal joining portion and the electrode terminal is increased for the same reason described above, it is found that the heat cycle endurance is also improved, when compared with the Comparative Example 2 as shown in Table 2.

It is obvious from the above described description that the joining structure between a ceramic heater and an electrode terminal and the joining method therefor according to the invention increase the reliability of the joining strength of a terminal joining portion of a heater and an electrode terminal, and also allows for the longer life of the heater.

What is claimed is:

1. A joined structure comprising a ceramic heater and an electrode terminal, the ceramic heater comprising a heating element and a ceramic base material in which the heating element is embedded;
   wherein a metallized layer is formed on the surface of the ceramic base material to which the electrode terminal is joined, said metallized layer comprising an active metal solder including at least one of Ag—Cu—Ti alloy, Cu—Ti alloy and Au—Ti alloy; and
   a metal solder is interposed between said metallized layer and said electrode terminal to join the metallized layer and the electrode terminal.

2. The joined structure according to claim 1, wherein the ceramic base material is made of one of the materials selected from a group consisting of silicon nitride, aluminum nitride, and silicon carbide.

3. The joined structure according to claim 1, wherein the electrode terminal is made of a metal that includes as main ingredients one or more kinds of groups consisting of Fe, Ni, and Co.

4. The joined structure according to claim 3, wherein the electrode terminal is made of kovar.

5. The joined structure according to claim 1, wherein the ceramic heater is a heater for use in bonding.

6. The joined structure according to claim 5, wherein the heater for use in bonding comprises a heater portion in which said heating element is embedded and a holder portion integrally combined to said heater portion for securing said heater portion.

7. A method for joining a ceramic heater comprising a ceramic base material in which a heating element is embedded and an electrode terminal, the method comprising:
   forming a metallized layer on the surface of the ceramic base material to which the electrode terminal is joined, the metallized layer comprising an active metal solder including at least one of Ag—Cu—Ti alloy, Cu—Ti alloy and Au—Ti alloy;
   placing a metal solder between said metallized layer and said electrode terminal; and
   then heat-treating the metallized layer and metal solder to join the ceramic heater and the electrode terminal.

8. The method for joining a ceramic heater and an electrode terminal according to claim 7, wherein the electrode terminal is made of a metal which includes as main ingredients one or more kinds of groups consisting of Fe, Ni, and Co.

9. The method for joining a ceramic heater and an electrode terminal according to claim 8, wherein the electrode terminal is made of kovar.

10. The method for joining a ceramic heater and an electrode terminal according to claim 7, wherein the ceramic heater is a heater for use in bonding.

11. The method for joining a ceramic heater and an electrode terminal according to claim 10, wherein the heater for use in bonding comprises a heater portion in which said heating element is embedded and a holder portion which is integrally combined to the heater portion for holding the heater portion.

12. The method for joining a ceramic heater and an electrode terminal according to claim 7, wherein the ceramic base material is made of one of the materials selected from a group consisting of silicon nitride, aluminum nitride, and silicon carbide.

* * * * *